United States Patent
Pasotti et al.

(10) Patent No.: US 6,466,481 B1
(45) Date of Patent: Oct. 15, 2002

(54) DEVICE AND METHOD FOR PROGRAMMING NONVOLATILE MEMORY CELLS WITH AUTOMATIC GENERATION OF PROGRAMMING VOLTAGE

(75) Inventors: Marco Pasotti, Martino Siccomario; Roberto Canegallo, Tortona; Giovanni Guaitini, Trecella; Pier Luigi Rolandi, Monleale, all of (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 0 days.

(21) Appl. No.: 09/438,232

(22) Filed: Nov. 12, 1999

(30) Foreign Application Priority Data

Nov. 13, 1998 (IT) .......................... TO98A0961

(51) Int. Cl.[7] .............................................. G11C 16/06
(52) U.S. Cl. .............. 365/185.21; 365/207; 365/185.18
(58) Field of Search ........................... 365/185.21, 207, 365/189.01, 185.18, 185.26

(56) References Cited

U.S. PATENT DOCUMENTS 5,748,534 A * 5/1998 Dunlap et al. ......... 365/185.21
5,841,695 A * 11/1998 Wik ....................... 365/185.08
6,194,967 B1 * 2/2001 Johnson ....................... 330/288

* cited by examiner

*Primary Examiner*—David Lam
(74) *Attorney, Agent, or Firm*—Lisa K. Jorgenson; Brian L. Johnson; Seed IP Law Group, PLLC

(57) ABSTRACT

The device comprises a current mirror circuit having a first and a second node connected, respectively, to a constant current source and to a drain terminal of a memory cell to be programmed. A voltage generating circuit is connected to the first node to bias it at a constant reference voltage ($V_R$); an operational amplifier has an inverting input connected to the first node, a non-inverting input connected to the second node, and an output connected to the control terminal of the memory cell. Thereby, the drain terminal of the memory cell is biased at the constant reference voltage, having a value sufficient for programming, and the operational amplifier and the memory cell form a negative feedback loop that supplies, on the control terminal of the memory cell, a ramp voltage ($V_{PCX}$) that causes writing of the memory cell. The ramp voltage increases with the same speed as the threshold voltage and can thus be used to know when the desired threshold value is reached, and thus when programming must be stopped. The presence of a bias transistor between the second node and the memory cell enables use of the same circuit also during reading.

24 Claims, 3 Drawing Sheets

DEVICE AND METHOD FOR PROGRAMMING NONVOLATILE MEMORY CELLS WITH AUTOMATIC GENERATION OF PROGRAMMING VOLTAGE

TECHNICAL FIELD

The present invention refers to a device and a method for programming nonvolatile memory cells with automatic generation of the programming voltage.

BACKGROUND OF THE INVENTION

As is known, programming of nonvolatile memory cells, for example of the flash or EEPROM types, is based upon injection of hot electrons, according to which sufficiently energetic electrons are trapped in the floating gate region of the memory cell to be programmed.

For this purpose, between the drain terminal and the source terminal of the cell to be written a high voltage is applied, so as to supply the electrons moving between these terminals with a sufficient energy to overcome the oxide potential gap. At the same time, by forcing on the gate terminal a potential higher than the drain terminal potential, an electric field is obtained that attracts the electrons towards the floating gate region through the oxide layer between the floating gate region and the channel region. The thus entrapped electrons modify of the threshold voltage of the cell.

Hot electron injection is, by its very nature, not controlled and not repeatable with precision. To obtain accurate programming of the cell, it is therefore necessary to use programming methods and/or control devices that enable interruption of the writing process when the desired threshold voltage value is reached.

For this purpose, many programming techniques of nonvolatile memory cells are known.

According to a first solution, programming is carried out by supplying the cell gate terminal with a number of programming pulses (write phase) and reading the threshold voltage after each pulse (verify phase). The programming process is stopped when the threshold voltage value read during verify is equal to the desired threshold voltage value.

The above solution, however, has the disadvantage that writing and verifying require distinct circuits and cannot be carried out at the same time. In addition, switching between write and verify configurations involves transients that must be exhausted before starting subsequent reading or writing. Consequently, the required programming times are long. In addition, the presence of different read and write circuits that the device has considerable overall dimensions. Furthermore, the write circuit must include devices for generating a ramp voltage necessary for biasing the control gate terminal. For this purpose, a digital-to-analog converter (DAC) is generally used, which, in turn, involves an increase in the required space.

A second solution (described in European Patent Application No. 97830477.2 dated Sep. 29, 1997) is based upon the circuit illustrated in FIG. 1. In this circuit, a memory cell 1, receiving at a gate terminal a voltage $V_G$, has its drain terminal connected to a node 3 through a first bias transistor 2. The node 3 is connected to a current mirror circuit 4 comprising transistors 5 and 6. Transistor 6 is connected to an output transistor 7 through a second bias transistor 8. Bias transistors 2 and 8 have gate terminals connected together and to a bias voltage $V_B$. An operational amplifier 9 has an inverting input connected to node 3, a non-inverting input connected to the drain terminal of transistor 6, and an output connected to the gate terminal of output transistor 7. The output voltage of the operational amplifier 9 is indicated by $V_O$.

At the start of the programming phase, a high voltage $V_B$ (for example, 8 V) is supplied to the gate terminals of bias transistors 2 and 8, while a high voltage $V_G$ (for example, 12 V) is supplied to the gate terminal of cell 1 to be programmed. In these conditions, injection of hot electrons occurs in the floating gate region of cell 1, the threshold voltage of which increases. Consequently, the current $I_f$ flowing in cell 1 decreases, whilst the potential of the node 3 increases. Under the effect of the operational amplifier 9, the voltage of the gate terminal of the output transistor 7 decreases, and hence also the current $I_7$ flowing in transistor 7 decreases. During the programming phase, the currents $I_f$ and $I_7$ are not equal, but are, however, linked to each other. Therefore, the output voltage $V_O$ is, instant by instant, linearly dependent on the threshold voltage of cell 1, and for this reason gives a reading of the instantaneous value of the threshold voltage. The writing process is interrupted when the instantaneous value of the threshold voltage reaches the desired value.

In this case, a disadvantage is that the measurement of the instantaneous threshold voltage made through reading voltage $V_O$ is accurate and reliable only for medium-to-low values of the drain-to-source voltage of cell 1. Since the drain-to-source voltage increases during writing, the method described can be used only during an initial phase of the process; subsequently, it is necessary to resort to the traditional method, carrying out write and verify cycles to complete programming of the cell. Consequently, even though the write time is reduced, the presented solution involves a certain number of transients for switching between the write and verify configurations. In addition, a special write circuit is required for carrying out writing cycles, and thus the overall dimensions of the device remain larger then desired.

SUMMARY OF THE INVENTION

An embodiment of the invention is directed to an integrated memory device that includes a nonvolatile memory cell, a current mirror circuit, a negative feedback branch. The nonvolatile memory cell has first and second conduction terminals and a control terminal. The current mirror circuit has first and second nodes with the second node being coupled to the first conduction terminal of the memory cell. The negative feedback branch has first and second inputs and an output, the first and second inputs being connected to the first and second nodes, respectively, the output of the negative feedback means being connected to the control terminal of the memory cell. Such a current mirror and negative feedback branch provide an appropriate programming voltage to the memory cell during a programming phase and provide a drain voltage to the memory cell that is sufficiently low to prevent soft writing of the memory cell during a reading phase.

BRIEF DESCRIPTION OF THE DRAWINGS

For a better understanding of the invention, an embodiment is now described, purely to present a non-limiting example and with reference to the attached drawings, wherein.

DETAILED DESCRIPTION OF THE INVENTION

Figure 1:
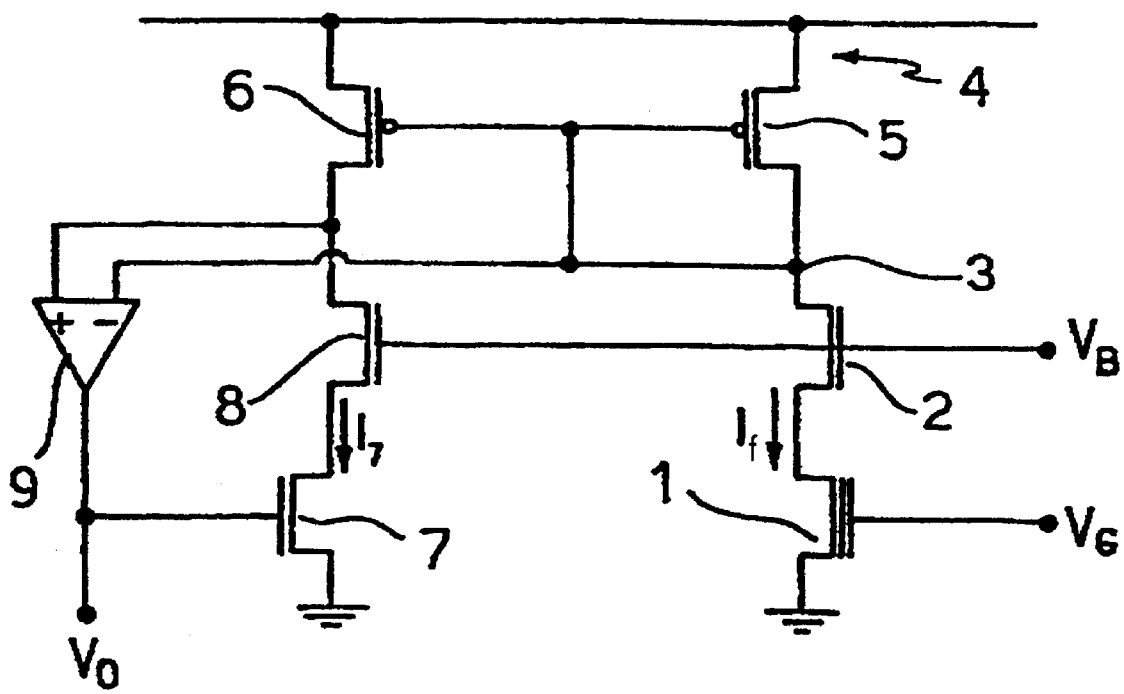
FIG. 1 is a simplified electrical diagram of a part of a device for programming nonvolatile memory cells of known type.
Figure 2:
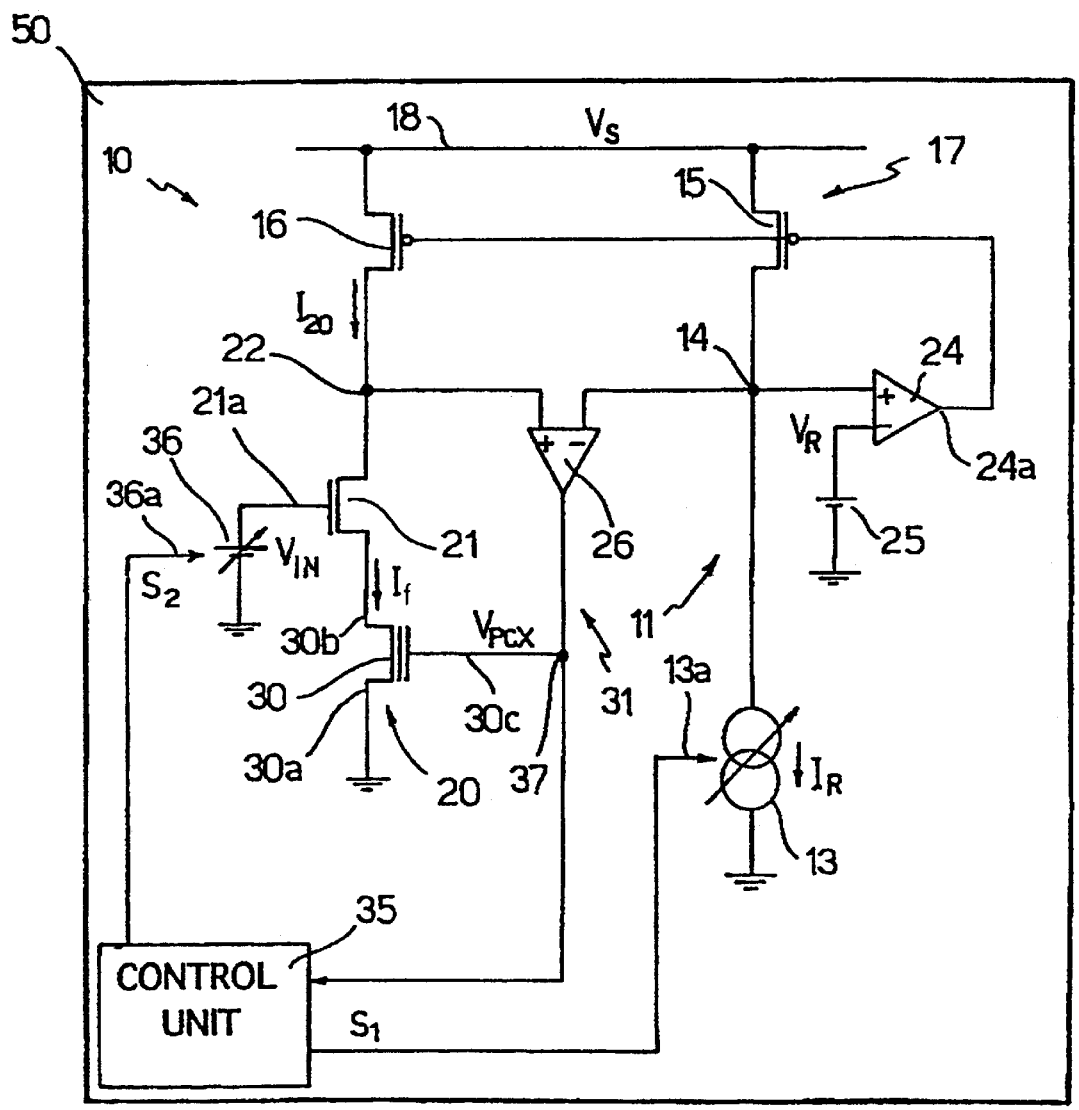
FIG. 2 is an electrical diagram of a device for programming and reading nonvolatile memory cells according to the present invention.

With reference to FIG. 2, a read/write circuit of nonvolatile memory cells is indicated at 10 (hereinafter, this circuit will be referred to as an R/W circuit 10) belonging to an integrated device 50, typically a memory, and comprising a first branch 11 and a second branch 20.

The first branch 11 of the R/W circuit 10 comprises a programmable current source 13 connected to a node 14 and having a control terminal 13a receiving a first control signal $s_1$, from a control unit 35 so as to supply a current $I_R$ switchable between a first and a second value, for example, approximately 5 µA and 400 µA, respectively. In addition, a drain terminal of a first transistor 15 forming with a second transistor 16 a current mirror circuit 17 is connected to node 14. Both transistors 15 and 16 are of PMOS type and have source terminals connected to a supply line 18 supplying a supply voltage $V_s$ and gate terminals connected together.

The second branch 20 of the R/W circuit 10 comprises, in addition to the second transistor 16, a bias transistor 21 of NMOS type. Bias transistor 21 has a drain terminal connected to the drain terminal of the second transistor 16 and to a node 22, and a source terminal connected (via known selection circuits, not illustrated) to the drain terminal 30b of a memory cell 30. The bias transistor 21 further has a gate terminal 21a connected to a first voltage source 36 of programmable type having an input 36a receiving a second control signal $S_2$ from a control unit 35 so as to supply a voltage $V_{IN}$ switchable between a first and a second value, for example, approximately 1.2 V and 10 V, respectively.

A first operational amplifier 24 has an inverting input connected to a second voltage source 25 supplying a reference voltage $V_R$ of, for example, 5 V, a non-inverting input connected to node 14, and an output 24a connected to the gate terminals of transistors 15 and 16.

A second operational amplifier 26 has an inverting input connected to node 14, a non-inverting input connected to node 22, and an output connected to a node 37 and supplying a gate voltage $V_{PCX}$.

Memory cell 30 has a source terminal 30a connected to ground and a gate terminal 30c connected to node 37.

In this way, the operational amplifier 26, the memory cell 30, and the bias transistor 21 form a feedback loop 31.

During reading, the current source 13, upon control of the first signal $S_1$ issued by the control unit 35, forces the first current value $I_R$ (in the example considered, 5 µA) in the branch 11, whilst the voltage source 36, upon control of the second signal $S_2$ issued by the control unit 35, biases the gate terminal 21a of bias transistor 21 at the initial value $V_{IN}$ (in the example, 1.2 V). Consequently, the potential of the drain terminal 30b of the memory cell 30 (corresponding to $V_{IN}$ minus the source-to-gate drop of bias transistor 21) is kept at a sufficiently low value to cause the memory cell to operate in a linear region, and to avoid soft programming, i.e., undesired writing of the cell during reading.

At equilibrium, the first operational amplifier 24 forces voltage at node 14 to have the reference voltage value $V_R$ (5 V). Likewise, the second operational amplifier 26 forces the voltage at node 22 to the same value. Consequently, the transistors 15 and 16 present equal gate-to-source and drain-to-source drops and carry the same current. As a result, in the bias transistor 21 and in the memory cell 30 a current 120 flows which is equal to current $I_R$ of branch 11.

In addition, as is known, the current $I_f$ flowing in memory cell 30, equal to current $I_{20}$, is given by the following expression:

$$I_f = K_f^* (W/L)_f^* [(V_{PCX} - V_{thf}) - V_{DSf}/2]^* V_{DSf} \quad (1)$$

where: $K_f$ is a constant due to the fabrication process, $(W/L)_f$ is the dimensional width/length ratio, $V_{thf}$ is the threshold voltage, $V_{DSf}$ is the drain-to-source voltage drop, and the term $(V_{PCX} - V_{thf})$ is the overdrive of memory cell 30.

In the imposed bias conditions, the term $V_{DSf}/2$ is negligible compared to the term $(V_{PCX} - V_{thf})$, and Eq. (1) reduces to $$I_f = K_f^* (W/L)_f^* (V_{PCX} - V_{thf})^* V_{DSf} \quad (2)$$

In addition, bias transistor 21 operates in saturation, thus the current flowing through it (of value $I_{20}$) is given by the following expression:

$$I_{20} = K_{21}^* (W/L)_{21}^* (V_{GS21} - V_{th21}) \quad (3)$$

In Eq. (3), apart from the subscripts, the symbols have the already discussed meaning, and $V_{GS21}$ is the gate-to-drain drop of bias transistor 21.

Since current $I_{20}$ is equal to $I_R$, it is constant. Consequently, also the value of the voltage $V_{GS21}$ is constant, as may be derived from Eq. (4)

$$V_{GS21} = V_{th21} + \sqrt{\frac{I_{20}}{K_{21}(W/L)_{21}}} \quad (4)$$

Consequently, also the drain-to-source voltage of cell 30, given by the following equation:

$$V_{DSf} = V_{IN} - V_{GS21} \quad (5)$$

is constant.

It follows that the gate voltage $V_{PCX}$ of the memory cell 30 is linearly dependent upon its threshold voltage $V_{th}$. Indeed, from Eq.(2), the following equation is obtained:

$$V_{PCX} = V_{thf} + \frac{I_f}{K_f(W/L)_f V_{DSf}} \quad (6)$$

wherein the second addendum is constant as above discussed.

During programming, upon control of signals $S_1$ and $S_2$ issued by control unit 35, the current source 13 forces the second value of the current $I_R$ (approximately 400 µA) in the branch 11, and the voltage $V_{IN}$ is brought to the second value (10 V).

As before, by virtue of operational amplifiers 24 and 26, nodes 14 and 22 are kept at voltage $V_R$ (5 V), transistors 15 and 16 are flown by equal currents, and currents $I_R$ and $I_{20}$ have the same value. In this phase, voltage $V_{IN}$ at the gate terminal 21a of bias transistor 21 is much higher than the voltage at the drain terminal of bias transistor 21 (namely, it is approximately twice as high). For this reason, bias transistor 21 behaves like a closed switch, and the voltage drop between its drain and source terminals is negligible.

Consequently, in this phase the voltage on the drain terminal 30b of memory cell 30 is basically equal to the voltage at node 22. The drain-to-source voltage of memory cell 30 (approximately 5 V) is thus sufficient to generate hot electrons. At the same time, the presence of the feedback loop 31 causes voltage $V_{PCX}$ to such a value as to maintain current $I_f$ forced in the branch 20. Consequently, in the memory cell 30 writing starts by injection of hot electrons.

As described in C. Calligaro, A. Manstretta, A. Modelli, G. Torelli, "Technological and Design Constraints for Multilevel Flash Memories", Proceedings of International Conference on Electronic Circuits and Systems, Rodes, Greece, pp. 1003–1008, during writing, after exhaustion of an initial transient, the time derivative of the threshold voltage depends upon the difference between the gate-to-source voltage and the present value of the threshold voltage. In other words, for the memory cell 30 the following relation applies:

$$V_{thf} = f_1(V_{PCX} - V_{thf}) \quad (7)$$

where the function $f_1$ is strictly increasing.

Also the drain current $I_f$, in the described conditions, depends upon the difference between the gate-to-source voltage and the present value of the threshold voltage, according to the following equation:

$$I_f = f_2(V_{PCX} - V_{thf}) \quad (8)$$

where $f_2$ is also strictly increasing.

Since current $I_f$ of memory cell 30 is constant, from Eq. (8) we obtain $$(V_{PCX} - V_{thf}) = C_1 \quad (9)$$

where $C_1$ is a first constant.

Consequently, from Eq. (7) the time derivative of the threshold voltage is found to be constant, and thus the threshold voltage varies linearly in time according to the following relation:

$$V_{thf} = V_{thfO} + C_2 t \quad (10)$$

in which $V_{thfO}$ is the threshold voltage at the end of the initial transient, t is the time, and $C_2$ is a second constant that represents the slope of $V_{thf}$.

Figure 3:
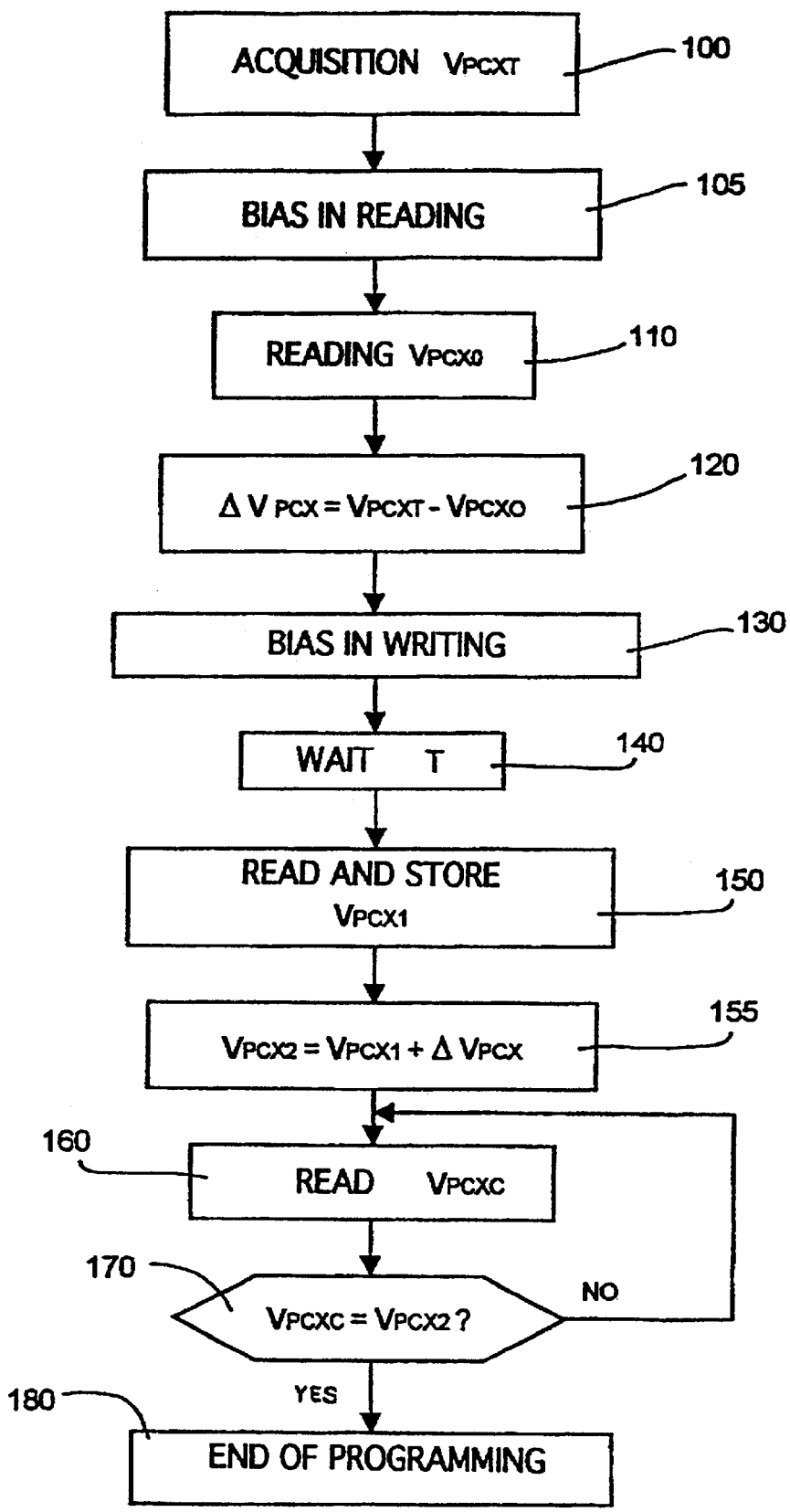
FIG. 3 is a block diagram of a method for programming nonvolatile memory cells, according to the present invention.

Finally, from Eq. (9) it may be noted that also gate voltage $V_{PCX}$ of memory cell 30 increases linearly in time forming a ramp having a slope equal to that of the threshold voltage. For this reason, reading the variations in the gate voltage $V_{PCX}$ provides an accurate and reliable measurement of the variations in the threshold voltage $V_{thf}$ and can be used to decide when programming is to be interrupted, according to what is described in detail hereinafter, with reference to the block diagram of FIG. 3.

Initially, the desired value during reading $V_{PCXT}$ for the gate voltage $V_{PCX}$ corresponding to a desired final threshold value $V_{thT}$ is acquired from outside (block 100); next, the R/W circuit is biased in read configuration (wherein the current $I_R$ of the branch 11 and the voltage $V_{IN}$ each assume the respective first value, block 105); and the initial value $V_{PCXO}$ of the gate voltage $V_{PCX}$ (block 110), corresponding to a memory cell 30 to be programmed, is read.

Subsequently, the increment $\Delta V_{PCX}$ of the gate voltage required to reach the desired value in reading $V_{PCXT}$ is calculated according to the following relation:

$$\Delta V_{PCX} = V_{PCXT} - V_{PCX0} \quad (11)$$

(block 120). According to Eq. (6) and Eq. (9), increment $\Delta V_{PCX}$ is equal to the increment $\Delta V_{th}$ of the threshold voltage of the memory cell 30, necessary for reaching the desired final threshold value $V_{thT}$.

Subsequently, the R/W circuit 10 is biased in write configuration (block 130), bringing the current $I_R$ in branch 11 and the voltage $V_{IN}$ to the respective second values. Next, a preset time interval T, determined experimentally (for example, 0.2 µs) (block 140), is awaited, to allow transients to end and the threshold voltage $V_{thf}$ starting increasing linearly. The increment in the threshold voltage $V_{thf}$ that takes place in this phase is negligible if compared to the values of the variations $\Delta V_{th}$ normally required.

At the end of the time interval T, a new value $V_{PCX1}$ of the gate voltage $V_{PCX}$ (block 150) is read and stored in memory. Since the threshold voltage $V_{thf}$ has not substantially changed, the value $V_{PCX1}$ still corresponds to the situation of the memory cell 30 to be programmed, but it is different from the value $V_{PCX0}$ acquired in read configuration because the bias conditions of the R/W circuit 10 have changed.

Subsequently, the final value $V_{PCX2}$ of the gate voltage $V_{PCX}$ is calculated according to the following equations $$V_{PCX2} = V_{PCX1} + \Delta V_{PCX} \quad (12)$$

corresponding to the desired final threshold value $V_{thT}$, block 155.

Then, iteratively, the gate voltage $V_{PCXC}$ is read (block 160) and verified as to whether it has reached the final value $V_{PCX2}$ (block 170).

If it has (output YES from block 170), the programming process is interrupted (block 180); otherwise (output NO), there is a return to block 160.

The described method and device have the following advantages. First, the described device is able to generate automatically, through the feedback loop 31, the necessary ramp voltage on the gate terminal 30c of the memory cell 30, during programming, as required for constant drain-current programming. Thus special ramp generators, necessary in traditional circuits, are avoided, thus reducing the overall dimensions of device 50.

In addition, throughout the process of programming the memory cell 30, the increment of the threshold voltage $V_{thf}$ can be monitored in an accurate and reliable way through the gate voltage $V_{PCX}$, thus enabling interrupting the programming procedure when the desired threshold voltage is reached. Consequently, there is no longer the need to resort to write and verify cycles, and the method is extremely fast, as well as precise.

Since reading and programming are both carried out by R/W circuit 10, it is not necessary to include in the device 50 two separate circuits for reading and for writing, with a consequent considerable reduction in the overall dimensions of the device 50 itself.

In the device 50, it is no longer necessary to provide a 5 V voltage regulator, in that the potentials of the nodes 14 and 22 and, during writing, the potential of the drain terminal 30b of the memory cell 30 are set by operational amplifiers 24 and 26, and on the inverting input of the first operational amplifier 24, only one reference voltage is supplied.

Finally, it is evident that modifications and variants can be made to the described method and device, without departing from the scope of the invention. For example, the first transistor 15 and the second transistor 16 may have either same or different dimensions; in particular, the first transistor 15 may be smaller than the second transistor 16, thus reducing the current $I_R$ flowing in the first branch 11, and thus reducing the consumption of the R/W circuit 10.

What is claimed is:

1. A device for programming a nonvolatile memory cell having a first terminal and a control terminal, the device comprising:

a current mirror circuit having a first and a second node, said first terminal of said memory cell being connected to said second node;

a negative feedback branch having a first and a second input and an output, said first and second inputs of said negative feedback branch being connected, respectively, to said first and second nodes, said output of said negative feedback being connected to said control terminal of said memory cell;

a constant current source connected to said first node; and reference voltage source connected to said first node.

2. A device according to claim 1 wherein said negative feedback branch comprise an operational amplifier.

3. A device according to claim 2 wherein said first input of said negative feedback branch is an inverting input, and said second input of said negative feedback branch is a non-inverting input of said operational amplifier.

4. A device according to claim 1 wherein said current mirror circuit comprises first and a second transistors connected between a supply line and said first and second nodes, respectively, and having respective control terminals connected to each other.

5. A device according to claim 4 wherein said reference voltage source comprises an operational amplifier having a first input connected to said first node, a second input connected to a preset voltage source, and an output connected to said control terminals of said first and second transistor.

6. A device according to claim 1, further comprising a read/write controller coupled to said first terminal of said memory cell.

7. A device according to claim 6 wherein said read/write controller comprises bias means arranged between said second node and said first terminal of said memory cell, said bias means being switchable between a first operating mode, wherein said bias means keep said first terminal of said memory cell at a preset voltage, and a second operating mode, wherein said bias means keep said first terminal of said memory cell at a voltage close to a voltage of said second node; wherein said current source is switchable between a first operating mode, wherein said current source generates a first current value, and a second operating mode, wherein said current source generates a second current value higher than said first value.

8. A device according to claim 7 wherein said read/write controller comprises control means for generating first and second control signals for said current source and said bias means, respectively, to bring selectively both said bias means and said current source into said first respective operating modes, or both said bias means and said current source into said second respective operating modes.

9. A device according to claim 7 wherein said bias means comprise a MOS transistor and a programmable voltage source; said MOS transistor having a first and a second terminal connected, respectively, to said second node and to said first terminal of said memory cell, and a control terminal connected to said programmable voltage source.

10. A method for programming a nonvolatile memory cell having a first terminal and a control terminal, using a current mirror circuit having a first and a second node, said first terminal of said memory cell being connected to said second node, the method comprising:

supplying a constant programming current to said first node;

mirroring said constant current to said second node;

biasing said first terminal of said memory cell at a programming voltage; and generating a negative feedback between said second node and said control terminal of said memory cell thereby automatically generating a ramp voltage ($V_{PCX}$) on said control terminal of said memory cell.

11. A method according to claim 10, further comprising:

supplying a current having a first value to said first node;

mirroring said current having said first value to said second node;

biasing said first terminal of said memory cell at a reading voltage lower than said programming voltage;

generating a negative feedback between said second node and said control terminal of said memory cell;

detecting a first voltage value on said control terminal of said memory cell;

determining a desired voltage increment value;

supplying said first node with a current having a second value higher than said first value;

mirroring said current having said second value to said second node;

biasing said first terminal of said memory cell at said programming voltage;

generating a negative feedback between said second node and said control terminal of said memory cell;

detecting a second voltage value on said control terminal of said memory cell;

calculating a third voltage value equal to the sum of said second value and said increment value;

detecting a fourth voltage value on said control terminal of said memory cell; and if said fourth voltage value is equal to said third voltage value, interrupting said current and eliminating said programming voltage.

12. An integrated memory device, comprising:

a nonvolatile memory cell having first and second conduction terminals and a control terminal;

a current mirror circuit having first and second nodes, the second node being coupled to the first conduction terminal of the memory cell; and a negative feedback branch having first and second inputs and an output, the first and second inputs being connected to the first and second nodes, respectively, the output of the negative feedback means being connected to the control terminal of the memory cell to provide an appropriate programming voltage to the memory cell during a programming phase and to provide a drain voltage to the memory cell that is sufficiently low to prevent soft writing of the memory cell during a reading phase.

13. The memory of claim 12 wherein the negative feedback branch includes an operational amplifier with an inverting input coupled to the first input of the negative feedback branch, a non-inverting input coupled to the second input of the negative feedback branch, and an output coupled to the output of the negative feedback branch.

14. The memory of claim 12 wherein the current mirror circuit comprises first and second transistors connected between a supply line and, respectively, the first and second nodes, and having respective control terminals connected to each other.

15. An integrated memory device, comprising:

a nonvolatile memory cell having first and second conduction terminals and a control terminal;

a current mirror circuit having first and second nodes, the second node being coupled to the first conduction terminal of the memory cell;

a negative feedback branch having first and second inputs and an output, the first and second inputs being connected to the first and second nodes, respectively, the output of the negative feedback means being connected to the control terminal of the memory cell, wherein the current mirror circuit comprises first and second transistors connected between a supply line and, respectively, the first and second nodes, and having respective control terminals connected to each other; and an operational amplifier having a first input connected to the first node, a second input connected to a constant voltage source, and an output connected to the control terminals of the first and second transistors.

16. An integrated memory device, comprising:

a nonvolatile memory cell having first and second conduction terminals and a control terminal;

a current mirror circuit having first and second nodes, the second node being coupled to the first conduction terminal of the memory cell;

a negative feedback branch having first and second inputs and an output, the first and second inputs being connected to the first and second nodes, respectively, the output of the negative feedback means being connected to the control terminal of the memory cell, wherein the current mirror circuit comprises first and second transistors connected between a supply line and, respectively, the first and second nodes, and having respective control terminals connected to each other and wherein the first transistor has smaller dimensions than the second transistor so that a smaller current flows through the first transistor compared to the second transistor.

17. An integrated memory device, comprising:

a nonvolatile memory cell having first and second conduction terminals and a control terminal;

a current mirror circuit having first and second nodes, the second node being coupled to the first conduction terminal of the memory cell;

a negative feedback branch having first and second inputs and an output, the first and second inputs being connected to the first and second nodes, respectively, the output of the negative feedback means being connected to the control terminal of the memory cell;

a bias transistor coupled between the second node and the first terminal of the memory cell and having a control terminal; and a controlled voltage source coupled to the control terminal of the bias transistor, the controlled voltage source being switchable between a first voltage at which causes the bias transistor to keep the first terminal of the memory cell at a relatively low voltage, and a second voltage that causes the bias transistor to close which keeps the first terminal of the memory cell at a relatively high voltage close to a voltage of the second node.

18. The memory of claim 12, further comprising a controlled current source coupled to the first node and structured to generate a first current during a first operating mode and a second current, higher than the first current, during a second operating mode.

19. An integrated memory device, comprising:

a nonvolatile memory cell having first and second conduction terminals and a control terminal;

a current mirror circuit having first and second nodes, the second node being coupled to the first conduction terminal of the memory cell;

a negative feedback branch having first and second inputs and an output, the first and second inputs being connected to the first and second nodes, respectively, the output of the negative feedback means being connected to the control terminal of the memory cell;

a bias transistor coupled between the second node and the first terminal of the memory cell and having a control terminal;

a controlled voltage source coupled to the control terminal of the bias transistor and structured to provide a first voltage during a first operating mode and a higher, second voltage during a second operating mode, the second voltage being sufficient to cause the bias transistor to conduct sufficiently to place the first conduction terminal at substantially the same voltage as the second node;

a controlled current source coupled to the first node and structured to generate a first current during the first operating mode and a second current, higher than the first current, during the second operating mode; and a control unit having a first control output coupled to the controlled current source and a second control output coupled to the controlled voltage source, the controlled voltage source being structured to place the controlled current source and the controlled voltage source simultaneously in the first operating mode during a first time period and simultaneously in the second operating mode during a second time period.

20. A device for programming a nonvolatile memory cell having a first terminal and a control terminal, the device comprising:

a current mirror circuit having a first and a second node, said first terminal of said memory cell being connected to said second node;

a negative feedback branch having a first and a second input and an output, said first and second inputs of said negative feedback branch being connected, respectively, to said first and second nodes, said output of said negative feedback being connected to said control terminal of said memory cell;

a constant current source connected to said first node; and reference voltage source connected to said first node to provide an appropriate programming voltage to the memory cell during a programming phase and to provide a drain voltage to the memory cell that is sufficiently low to prevent soft writing of the memory cell during a reading phase.

21. A device for programming a nonvolatile memory cell having a first terminal and a control terminal, the device comprising:

a current mirror circuit having a first and a second node, said first terminal of said memory cell being connected to said second node;

a negative feedback branch having a first and a second input and an output, said first and second inputs of said negative feedback branch being connected, respectively, to said first and second nodes, said output of said negative feedback being connected to said control terminal of said memory cell;

a constant current source connected to said first node; and a constant voltage source connected to said first node without a variable voltage drop between the constant voltage source and the first node.

22. A device for programming a nonvolatile memory cell having a first terminal and a control terminal, the device comprising:

a current mirror circuit having a first and a second node, said first terminal of said memory cell being connected to said second node through a bias transistor to keep the voltage at said first terminal at a sufficiently low level during a read function of the memory cell to prevent undesired writing of the memory cell during the read function of the memory cell;

a negative feedback branch having a first and a second input and an output, said first and second inputs of said negative feedback branch being connected, respectively, to said first and second nodes, said output of said negative feedback being connected to said control terminal of said memory cell;

a constant current source connected to said first node; and reference voltage source connected to said first node.

23. A device for programming a nonvolatile memory cell having a first terminal and a control terminal, the device comprising:

a current mirror circuit having a first and a second node, said first terminal of said memory cell being connected to said second node;

a negative feedback branch having a first and a second input and an output, said first and second inputs of said negative feedback branch being connected, respectively, to said first and second nodes, said output of said negative feedback being connected to said control terminal of said memory cell;

a constant current source connected to said first node; and reference voltage source connected to said first node, wherein said reference voltage source comprises an operational amplifier having a first input connected to said first node, a second input connected to a preset voltage source, and an output connected to said control terminals of said first and second transistor.

24. An integrated memory device, comprising:

a nonvolatile memory cell having first and second conduction terminals and a control terminal;

a current mirror circuit having first and second nodes, the second node being coupled to the first conduction terminal of the memory cell;

a negative feedback branch having first and second inputs and an output, the first and second inputs being connected to the first and second nodes, respectively, the output of the negative feedback means being connected to the control terminal of the memory cell to provide an appropriate programming voltage to the memory cell during a programming phase and to provide a drain voltage to the memory cell that is sufficiently low to prevent soft writing of the memory cell during a reading phase; and an operational amplifier having a first input connected to the first node, a second input connected to a constant voltage source, and an output connected to the control terminals of the first and second transistors.

* * * * *